United States Patent
Kakimoto et al.

(10) Patent No.: US 8,586,448 B2
(45) Date of Patent: Nov. 19, 2013

(54) METHOD AND APPARATUS FOR FORMING SILICON FILM

(75) Inventors: Akinobu Kakimoto, Nirasaki (JP); Satoshi Takagi, Nirasaki (JP); Kazuhide Hasebe, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/537,622

(22) Filed: Jun. 29, 2012

(65) Prior Publication Data

US 2013/0005142 A1    Jan. 3, 2013

(30) Foreign Application Priority Data

Jun. 30, 2011 (JP) ................................. 2011-145680
May 21, 2012 (JP) ................................. 2012-116061

(51) Int. Cl.
*H01L 21/76* (2006.01)

(52) U.S. Cl.
USPC .................................. 438/430; 257/E21.585

(58) Field of Classification Search
USPC .................. 438/361, 430, 703, 764, 629; 257/E21.585, E23.131
See application file for complete search history.

(56) References Cited

U.S. PATENT DOCUMENTS

| | | | |
|---|---|---|---|
| 7,265,025 B2* | 9/2007 | Temmler et al. | 438/435 |
| 7,943,463 B2* | 5/2011 | Khandekar et al. | 438/259 |
| 8,242,500 B2* | 8/2012 | Meunier-Beillard et al. | 257/51 |
| 2004/0261710 A1* | 12/2004 | Matsushita et al. | 118/719 |
| 2005/0277248 A1* | 12/2005 | Kim et al. | 438/253 |
| 2005/0287763 A1* | 12/2005 | Kim et al. | 438/424 |
| 2008/0185626 A1* | 8/2008 | Cheng | 257/301 |
| 2009/0179310 A1* | 7/2009 | Dunton et al. | 257/656 |
| 2011/0198591 A1* | 8/2011 | Meunier-Beillard et al. | 257/51 |
| 2011/0287629 A1* | 11/2011 | Kakimoto et al. | 438/652 |
| 2012/0048342 A1* | 3/2012 | Lim et al. | 136/249 |

FOREIGN PATENT DOCUMENTS

JP    10321556    12/1998

* cited by examiner

*Primary Examiner* — Daniel Luke
*Assistant Examiner* — Latanya N Crawford
(74) *Attorney, Agent, or Firm* — Cantor Colburn LLP

(57) ABSTRACT

Provided is a method and apparatus for forming a silicon film, which are capable of suppressing generation of a void or seam. The method includes performing a first film-forming process, performing an etching process, performing a doping process, and performing a second film-forming process. In the first film-forming process, a non-doped silicon film that is not doped with an impurity is formed so as to embed a groove of an object. In the etching process, the non-doped silicon film formed via the first film-forming process is etched. In the doping process, the non-doped silicon film etched via the etching process is doped with an impurity. In the second film-forming process, an impurity-doped silicon film is formed so as to embed the silicon film doped via the doping process.

14 Claims, 13 Drawing Sheets

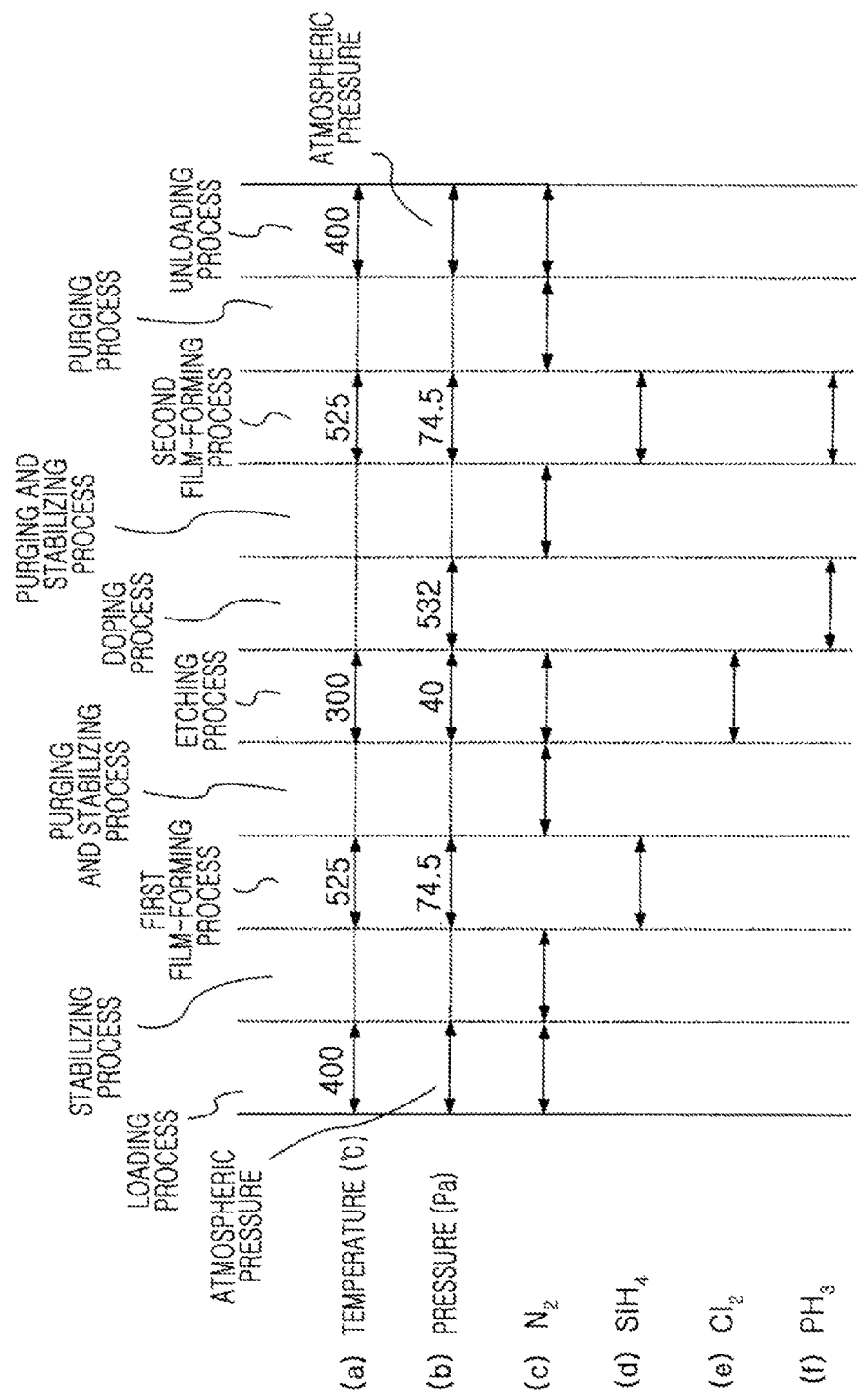

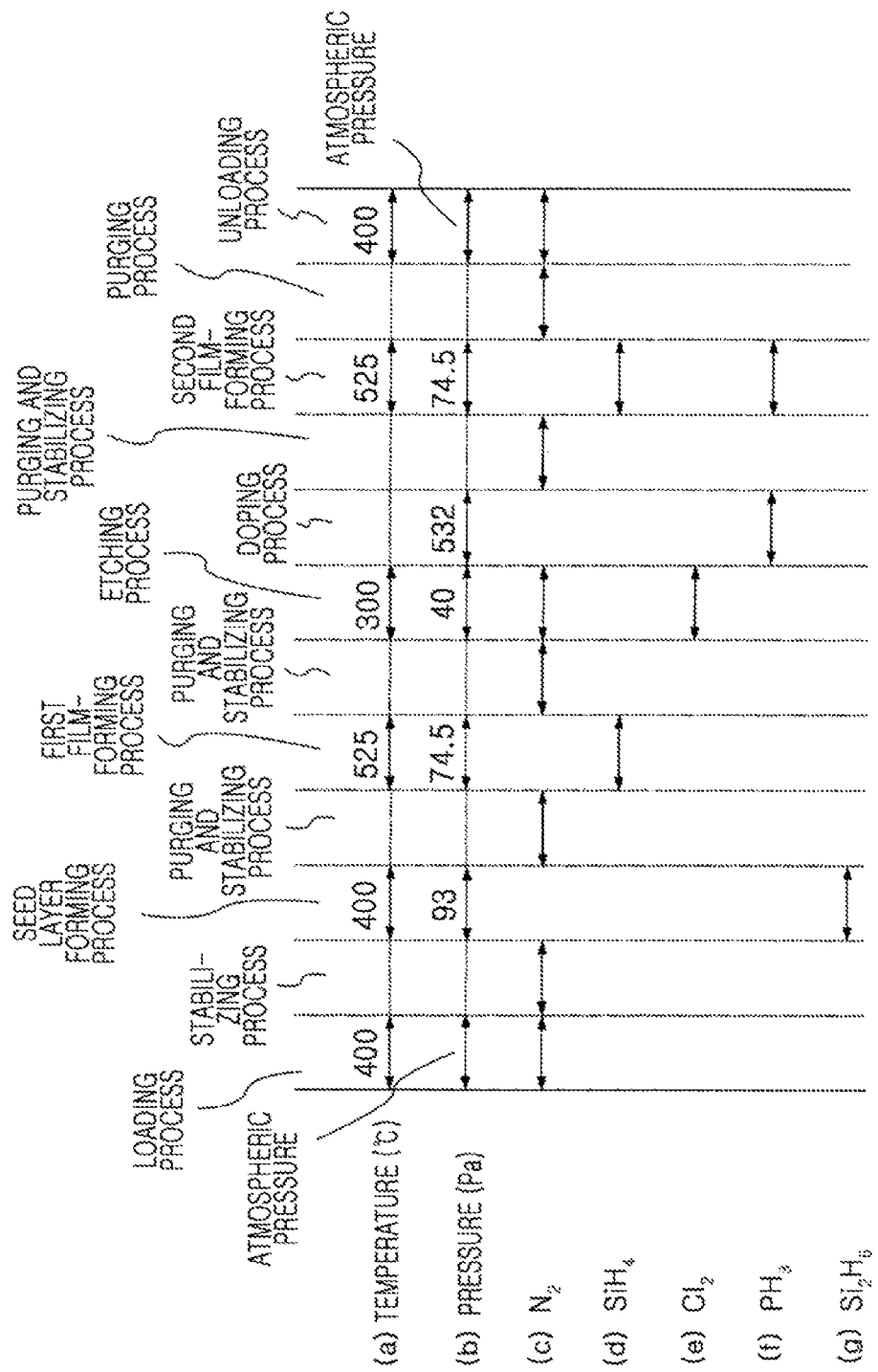

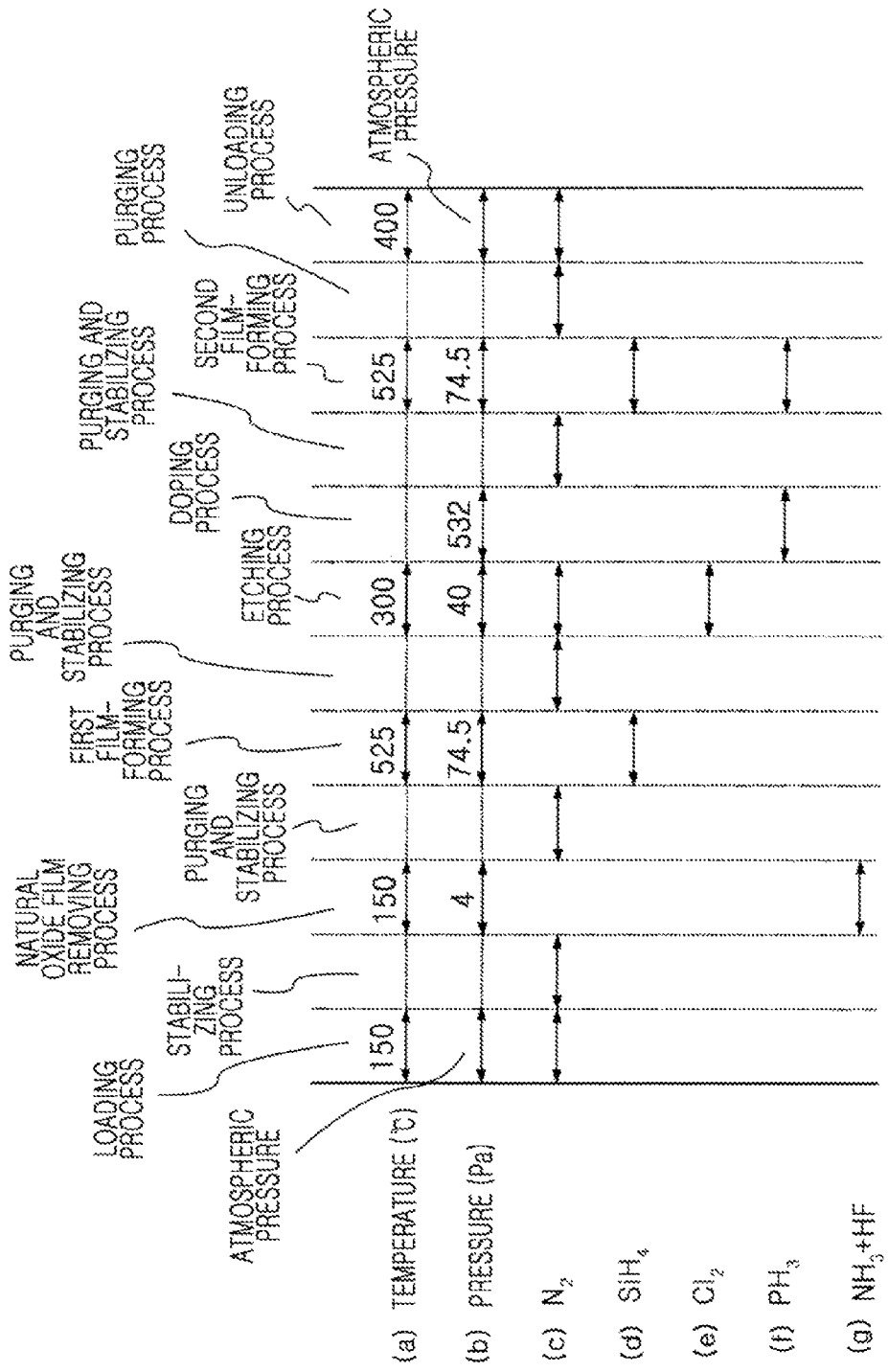

METHOD AND APPARATUS FOR FORMING SILICON FILM

CROSS-REFERENCE TO RELATED PATENT APPLICATIONS

This application claims the benefit of Japanese Patent Application No. 2011-145680, filed on Jun. 30, 2011 and Japanese Patent Application No. 2012-116061, filed on May 21, 2012, in the Japan Patent Office, the disclosure of which are incorporated herein in its entireties by reference.

BACKGROUND OF THE INVENTION

1. Field of the Invention

The present invention relates to a method and apparatus for forming a silicon film.

2. Description of the Related Art

Manufacturing processes of a semiconductor device or the like include a process of forming a trench and a groove having a hole shape (contact hole) in an interlayer insulation film on a silicon substrate, and forming an electrode by embedding a silicon film (Si film), such as an impurity-doped polysilicon film or amorphous film.

As such a process, for example, Patent Document 1 discloses a method of forming a contact hole in an interlayer insulation film on a silicon substrate, forming a polysilicon film by a chemical vapor deposition (CVD) method, slightly etching the polysilicon film, and then again forming the polysilicon film.

However, according to such a method of forming a Si film, a surface roughness of the Si film may be deteriorated due to etching when an impurity-doped polysilicon film, for example, a P-doped Si film, is used as the Si film. This is assumed to be caused because the etching is performed from a P-site in the P-doped Si film. Thus, if the P-doped Si film is additionally formed on the P-doped Si film having the deteriorated surface roughness, a void or seam is easily generated.

(Patent Document 1) Japanese Laid-Open Patent Publication No. hei 10-321556

SUMMARY OF THE INVENTION

The present invention provides a method and apparatus for forming a silicon film capable of preventing generation of a void or seam.

According to an aspect of the present invention, there is provided a method of forming a silicon film on a groove in a surface of an object, the method including performing a first film-forming process of forming a non-doped silicon film which is not doped with an impurity, so as to embed the groove of the object, performing an etching process of etching the non-doped silicon film formed via the first film-forming process, performing a doping process of doping the non-doped silicon film etched via the etching process with an impurity, and performing a second film-forming process of forming an impurity-doped silicon film so as to embed the non-doped silicon film doped via the doping process.

According to another aspect of the present invention, there is provided an apparatus for forming a silicon film on a groove on a surface of an object, the apparatus including a first film-forming unit which forms a non-doped silicon film that is not doped with an impurity, so as to embed the groove of the object, an etching unit which etches the non-doped silicon film formed by using the first film-forming unit, a doping unit which dopes the non-doped silicon film etched by using the etching unit with an impurity, and a second film-forming unit which forms an impurity-doped silicon film so as to embed the non-doped silicon film doped by using the doping unit.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 3 is a diagram of a recipe for explaining a method of forming a silicon film, according to an embodiment of the present invention;

FIG. 6 is a diagram of a recipe for explaining a method of forming a silicon film, according to another embodiment of the present invention;

FIG. 8 is a diagram of a recipe for explaining a method of forming a silicon film, according to still another embodiment of the present invention.

DETAILED DESCRIPTION OF THE INVENTION

Figure 1:
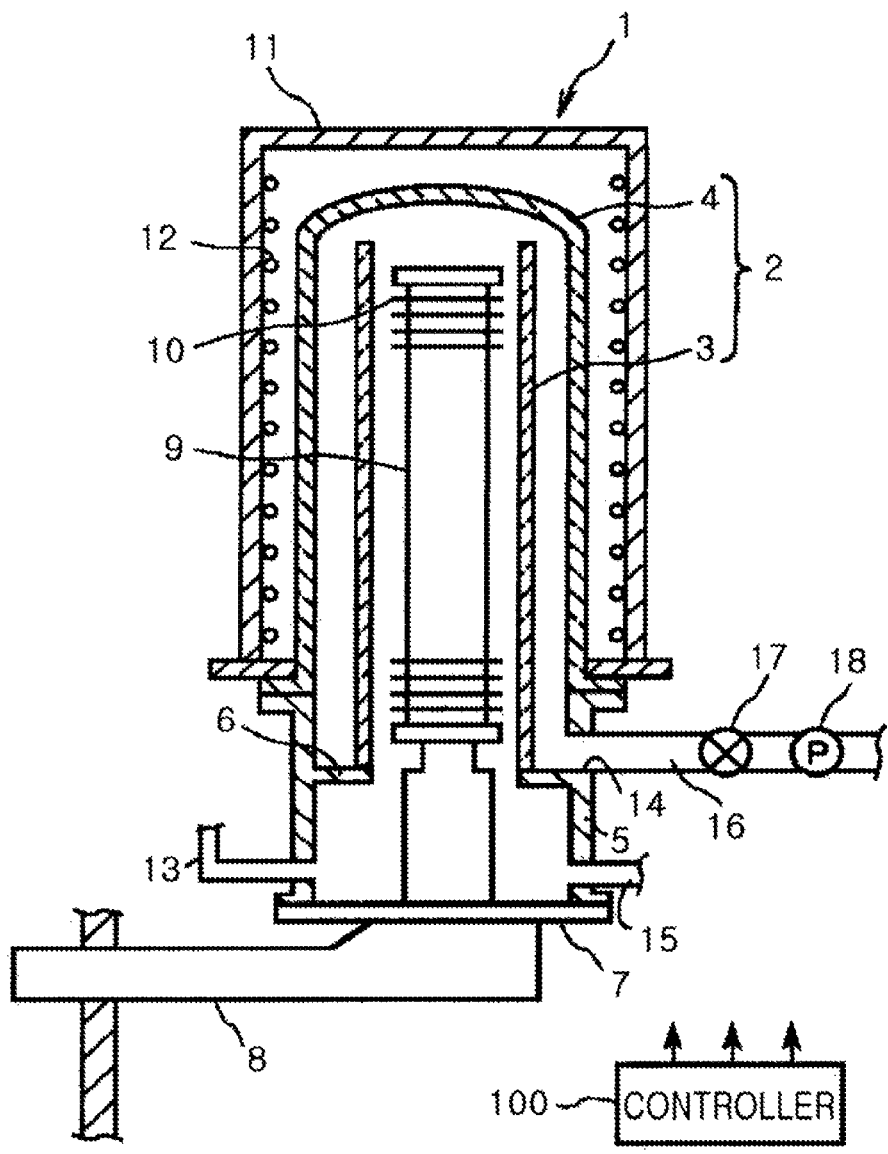
FIG. 1 is a view of a thermal treatment apparatus according to an embodiment of the present invention.

An embodiment of the present invention achieved on the basis of the findings given above will now be described with reference to the accompanying drawing. In the following description, the constituent elements having substantially the same function and arrangement are denoted by the same reference numerals, and a repetitive description will be made only when necessary.

Hereinafter, a method and apparatus for forming a silicon film according to the present invention will be described. In embodiments of the present invention, a batch-type vertical thermal treatment apparatus shown in FIG. 1 is used as an apparatus for forming a silicon film.

As shown in FIG. 1, a thermal treatment apparatus 1 includes a reaction pipe 2 having an approximate cylindrical shape where a length direction is in a vertical direction. The reaction pipe 2 has a double pipe structure including an inner pipe 3 and an outer pipe 4 covering the inner pipe 3 while having a ceiling formed to have a predetermined distance from the inner pipe 3. The inner and outer pipes 3 and 4 may be formed of a material having excellent heat-resistance and excellent corrosion-resistance, for example, quartz.

A manifold 5 formed of stainless steel (SUS) and having a container shape is disposed below the outer pipe 4. The manifold 5 is hermetically connected to a bottom of the outer pipe 4. The inner pipe 3 is supported by a support ring 6 which protrudes from an inner wall of the manifold 5 and is integrally formed with the manifold 5.

A cover body 7 is disposed below the manifold 5 and is capable of moving up and down by a boat elevator 8. When the cover body 7 moves up via the boat elevator 8, a bottom (furnace hole portion) of the manifold 5 is closed, and when the cover body 7 moves down via the boat elevator 8, the bottom (furnace hole portion) of the manifold 5 is opened.

A wafer boat 9 formed of, for example, quartz, is placed on the cover body 7. The wafer boat 9 is configured such that a plurality of target objects, for example, semiconductor wafers 10, are accommodated therein at predetermined intervals in a vertical direction.

A heat-insulation body 11 is provided around the reaction pipe 2 to surround the reaction pipe 2. A temperature increasing heater 12 formed of, for example, a resistance heater, is provided on an inner wall surface of the heat-insulation body 11. An inside of the reaction pipe 2 is heated to a predetermined temperature by the temperature increasing heater 12, and as a result, the semiconductor wafers 10 are heated to the predetermined temperature.

A plurality of processing gas introduction pipes 13 are inserted through (connected to) a side surface of the manifold 5. In FIG. 1, only one processing gas introduction pipe 13 is shown. The processing gas introduction pipe 13 is provided to communicate inside the inner pipe 3. For example, as shown in FIG. 1, the processing gas introduction pipe 13 is inserted through the side surface of the manifold 5 which is below the the support ring 6 (below the inner pipe 3).

The processing gas introduction pipe 13 is connected to a processing gas supply source (not shown) through a mass flow controller (MFC) (not shown) or the like. Accordingly, a desired amount of processing gas is supplied from the processing gas supply source into the reaction pipe 2 through the processing gas introduction pipe 13.

Examples of the processing gas supplied from the processing gas introduction pipe 13 include film-forming gases for forming silicon films (Si films), such as a polysilicon film, an amorphous silicon film, an impurity-doped polysilicon film, and an impurity-doped amorphous silicon film. When a non-doped Si film that is not doped with an impurity is formed, for example, $SiH_4$ is used as a film-forming gas. On the other hand, when an impurity-doped Si film is formed, for example, a gas including an impurity, such as $P(PH_3)$, $B(BCl_3, B_2H_6)$, $C(C_2H_4)$, $O(N_2O)$, or $N(N_2O)$, or $SiH_4$ is used. On the other hand, when a non-doped Si film that is not doped with an impurity is to be doped with an impurity, $PH_3$, $BCl_3$, or the like that is described above is used. According to a method of forming a silicon film of the present invention, as will be described below, after an Si film is embedded in a groove formed on a surface of the semiconductor wafers 10 during a first film-forming process, an opening portion of the embedded groove is enlarged via an etching process, and an Si film is embedded in the groove having the enlarged opening portion via a second film-forming process. Accordingly, an etching gas is used as the processing gas supplied from the processing gas introduction pipe 13. Examples of the etching gas include halogen gases, such as $Cl_2$, $F_2$, and $ClF_3$.

In the method of the present invention, as will be described below, when a seed layer is formed on the groove before the first film-forming process, a seed layer forming gas, for example, a higher silane, such as an amino group containing silane, $Si_2H_6$, or $Si_4H_{10}$, is supplied from the processing gas introduction pipe 13 into the reaction pipe 2. Examples of the amino group containing silane include bis tertiary butyl amino silane (BTBAS), tris dimethyl amino silane (3DMAS), tetra dimethyl amino silane (4DMAS), diisopropyl amino silane (DIPAS), bis diethyl amino silane (BDEAS), and bis dimethyl amino silane (BDMAS). Also, in the method of forming a silicon film, as will be described below, when a natural oxide film in the groove is removed before the first film-forming process, a natural oxide film removing gas, such as ammonia, hydrogen fluoride (HF), or a combination of ammonia and nitrogen trifluoride ($NF_3$), is supplied from the processing gas introduction pipe 13 into the reaction pipe 2.

An exhaust hole 14 for exhausting a gas inside the reaction pipe 2 is provided at a side surface of the manifold 5. The exhaust hole 14 is provided above the support ring 6, and communicates with a space formed between the inner pipe 3 and the outer pipe 4 in the reaction pipe 2. Also, an exhaust gas or the like generated in the inner pipe 3 is exhausted to the exhaust hole 14 through the space between the inner pipe 3 and the outer pipe 4.

A purge gas supply pipe 15 is inserted through the side surface of the manifold 5 below the exhaust hole 14. A purge gas supply source (not shown) is connected to the purge gas supply pipe 15, and a desired amount of purge gas, for example, a nitrogen gas, is supplied from the purge gas supply source into the reaction pipe 2 through the purge gas supply pipe 15.

An exhaust pipe 16 is hermetically connected to the exhaust hole 14. A valve 17 and a vacuum pump 18 are provided at the exhaust pipe 16 from an upstream side of the exhaust pipe 16. The valve 17 adjusts an opening degree of the exhaust pipe 16 and controls a pressure inside the reaction pipe 2 to be a predetermined pressure. The vacuum pump 18 adjusts the pressure inside the reaction pipe 2 while exhausting the gas inside the reaction pipe 2 through the exhaust pipe 16.

Also, a trap, a scrubber, or the like (not shown) is provided at the exhaust pipe 16 such that the exhaust gas exhausted from the reaction pipe 2 is exhausted outside the thermal treatment apparatus 1 after becoming harmless.

Figure 2:
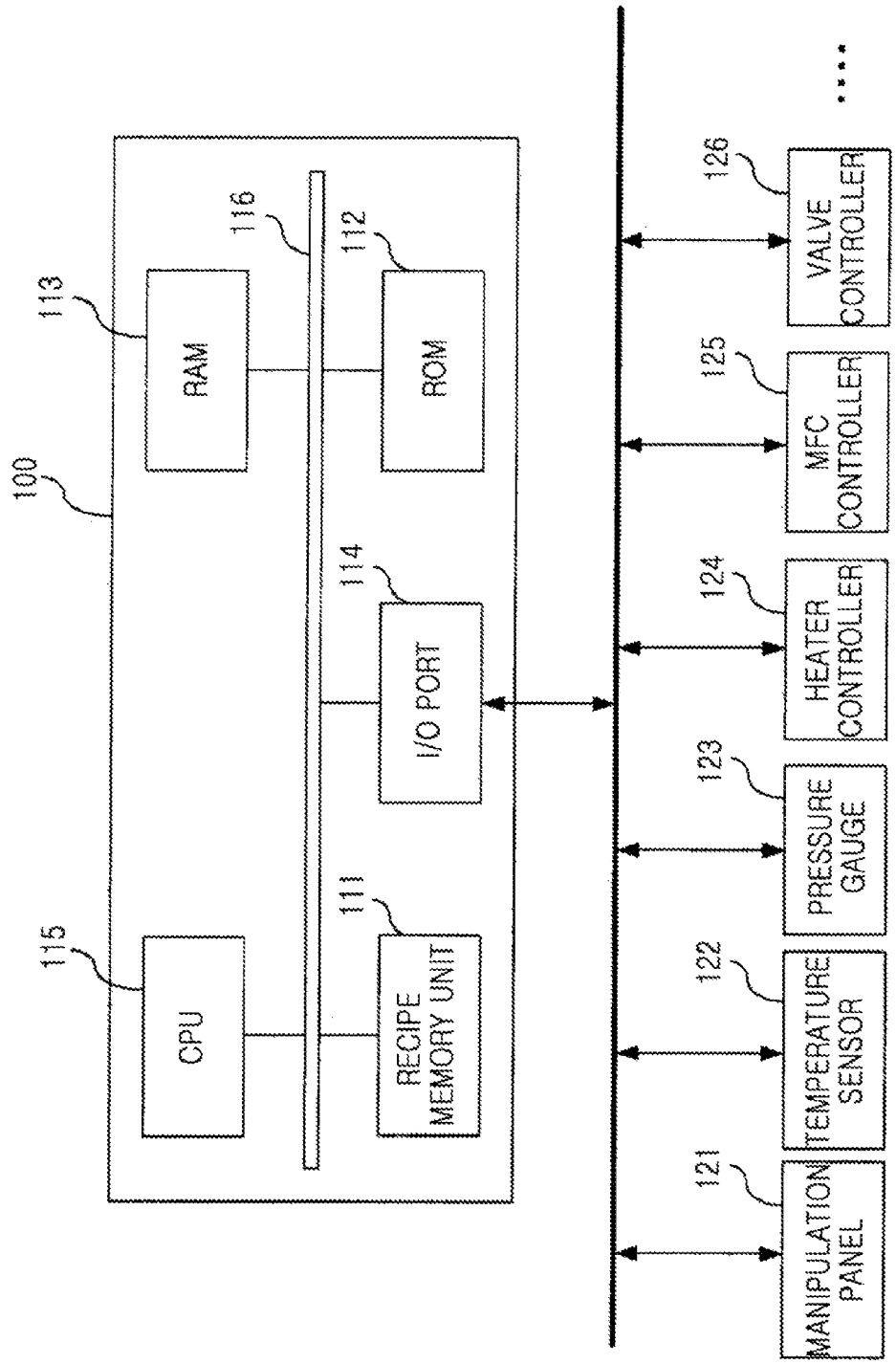
FIG. 2 is a diagram of a configuration of a controller of FIG. 1.

The thermal treatment apparatus 1 further includes a controller 100 for controlling each element thereof. FIG. 2 is a diagram of a configuration of the controller 100. As shown in FIG. 2, the controller 100 is connected to a manipulation panel 121, a temperature sensor (group) 122, a pressure gauge (group) 123, a heater controller 124, an MFC controller 125, a valve controller 126, etc.

The manipulation panel 121 includes a display screen and a manipulation button to transmit a manipulation direction of an operator to the controller 100 and display various types of information from the controller 100 on the display screen.

The temperature sensor (group) 122 measures a temperature of each element, for example, inside the reaction pipe 2, inside the processing gas introduction pipe 13, and inside the exhaust pipe 16, and notifies a measured value to the controller 100.

The pressure gauge (group) 123 measures a pressure of each element, for example, inside the reaction pipe 2, inside the processing gas introduction pipe 13, and inside the exhaust pipe 16, and notifies a measured value to the controller 100.

The heater controller 124 is used to separately control the temperature increasing heater 12. The heater controller 124 is electrically connected to the temperature increasing heater 12 to heat the temperature increasing heater 12 in response to a direction from the controller 100, and measures and notifies power consumption of the temperature increasing heater 12 to the controller 100.

The MFC controller 125 controls MFCs (not shown) provided at the processing gas introduction pipe 13 and the purge gas supply pipe 15 such that flow rates of gases flowing through the processing gas introduction pipe 13 and the purge gas supply pipe 15 become those directed by the controller 100, and measures and notifies actual flow rates of the gases to the controller 100.

The valve controller 126 controls an opening degree of a valve disposed at each pipe to be a value directed by the controller 100.

The controller 100 includes a recipe memory unit 111, a read-only memory (ROM) 112, a random access memory (RAM) 113, an input/output (I/O) port 114, a central processing unit (CPU) 115, and a bus 116 by which each of them is connected to each other.

The recipe memory unit 111 stores a setup recipe and a plurality of process recipes. Only the setup recipe is stored during an initial manufacture of the thermal treatment apparatus 1. The setup recipe is executed when a thermal model or the like according to each of thermal treatment apparatuses is generated. The process recipe is a recipe prepared per thermal process actually executed by a user, and for example, defines a temperature change of each element, a pressure change in the reaction pipe 2, and supply starting timing, supply stopping timings and a supply amount of a processing gas from when the semiconductor wafers 10 are loaded to the reaction pipe 2 to when the semiconductor wafers 10 after a process completion are unloaded.

The ROM 112 includes an electrically erasable and programmable read-only memory (EEPROM), a flash memory, a hard disk, and the like, and is a recording medium having recorded thereon an operation program or the like of the CPU 115.

The RAM 113 operates as a work area or the like of the CPU 115.

The I/O port 114 is connected to the manipulation panel 121, the temperature sensor (group) 122, the pressure gauge (group) 123, the heater controller 124, the MFC controller 125, the valve controller 126, etc. so as to control input and output of data or a signal.

The CPU 115 is a pivotal element of the controller 100, and executes a control program stored in the ROM 112 to control operations of the thermal treatment apparatus 1 according to a recipe (process recipe) stored in the recipe memory unit 111, based on a direction from the manipulation panel 121. In other words, the CPU 115 controls the temperature sensor (group) 122, the pressure gauge (group) 123, and the MFC controller 125 to respectively measure a temperature, a pressure, and a flow rate of each element in the reaction pipe 2, in the processing gas introduction pipe 13, and in the exhaust pipe 16, and controls each of the elements to follow a process recipe by outputting a control signal or the like to the heater controller 124, the MFC controller 125, and the valve controller 126 based on the measured data.

The bus 116 is a passage through which information is transferred between the respective elements.

Next, a method of forming a silicon film by using the thermal treatment apparatus 1 configured as above will now be described. In following descriptions, operations of each element forming the thermal treatment apparatus 1 are controlled by the controller 100 (CPU 115). During each process, a temperature, pressure a flow rate of a gas, etc. in the reaction pipe 2, are set to conditions based on, for example, a recipe shown in FIG. 3 by controlling the heater controller 124 (temperature increasing heater 12), the MFC controller 125, the valve controller 126, etc. by the controller 100 (CPU 115).

Figure 4A:
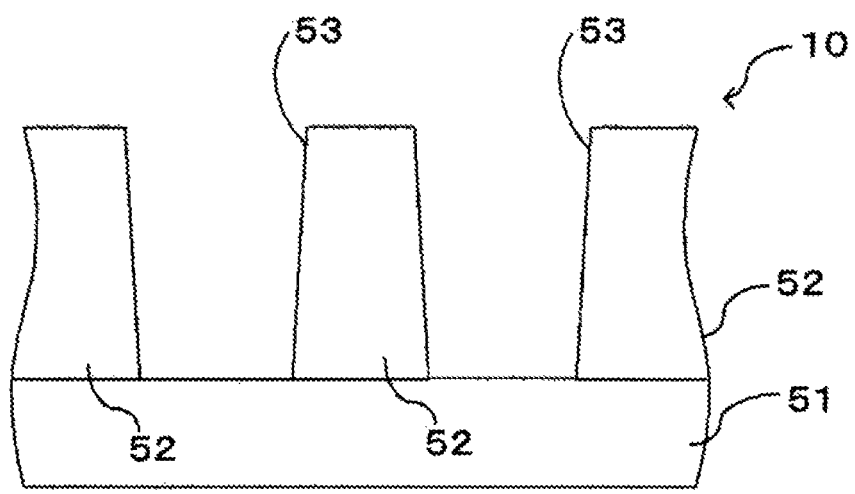
FIGS. 4A through 4C are views for explaining the method of forming a silicon film, according to an embodiment of the present invention.

In semiconductor wafers 10 as target objects of the present embodiment, an insulation film 52 is formed on a substrate 51 and a groove 53 for forming a contract hole is formed in a surface of the semiconductor wafers 10 as shown in FIG. 4A.

The method of forming a silicon film according to the present embodiment includes: performing a first film-forming process of forming a non-doped silicon film (Si film) 55 that has an opening portion 54 and is not doped with an impurity, such as a polysilicon film or an amorphous silicon film, so as to embed the groove 53; performing an etching process of enlarging the opening portion 54 by etching the non-doped Si film 55; performing a doping process of doping the non-doped Si film 55 having the enlarged opening portion 54 with an impurity (forming an impurity-containing Si film 56); and performing a second film-forming process of forming an impurity-doped Si film 57 so as to embed the opening portion 54 of the impurity-containing Si film 56. Hereinafter, the method including the above processes is described.

First, the inside of the reaction pipe 2 (inner pipe 3) is set to a predetermined temperature, for example, 400° C., as shown in FIG. 3(a). Also, as shown in FIG. 3(c), a predetermined amount of nitrogen is supplied from the purge gas supply pipe 15 to the inside of the inner pipe 3 (reaction pipe 2). Next, the wafer boat 9 accommodating the semiconductor wafers 10 shown in FIG. 4A is placed on the cover body 7. Then, the cover body 7 is elevated by the boat elevator 8, thereby loading the semiconductor wafers 10 (wafer boat 9) into the reaction pipe 2 (loading process).

Next, as shown in FIG. 3(c), the predetermined amount of nitrogen is supplied from the purge gas supply pipe 15 into the inner pipe 3 while the inside of the reaction pipe 2 is set to the predetermined temperature, for example, 525° C., as shown in FIG. 3(a). Also, a gas inside the reaction pipe 2 is exhausted so as to depressurize the inside of the reaction pipe 2 to a predetermined pressure, for example, 74.5 Pa (0.56 Torr), as shown in FIG. 3(b). Then, the inside of the reaction pipe 2 is stabilized to these predetermined temperature and pressure (stabilizing process).

Here, the temperature inside the reaction pipe 2 may be from 450° C. to 700° C., preferably, from 490° C. to 650° C. The pressure inside the reaction pipe 2 may be from 1.33 Pa to 133 Pa (from 0.01 Torr to 1 Torr). When the temperature and pressure inside the reaction pipe 2 are within the above ranges, a Si film may be further uniformly formed.

Figure 4B:
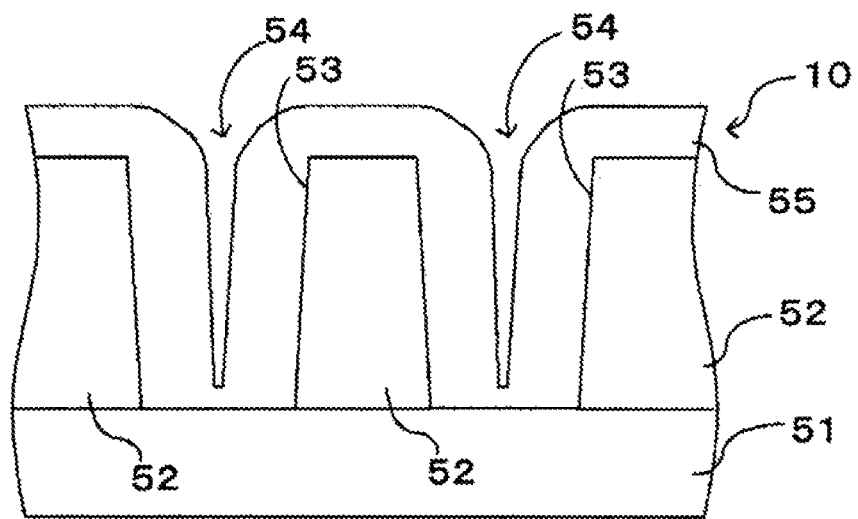

When the inside of the reaction pipe 2 is stabilized to the predetermined pressure and temperature, the supplying of nitrogen from the purge gas supply pipe 15 is stopped. Then, as shown in FIG. 3(d), a predetermined amount of film-forming gas, for example, $SiH_4$, is supplied from the processing gas introduction pipe 13 into the reaction pipe 2 (first film-forming process). Via the first film-forming process, the non-doped Si film 55 having the opening portion 54 and not doped with an impurity is formed on the insulation film 52 and in the groove 53 of the semiconductor wafers 10, as shown in FIG. 4B.

Here, in the first film-forming process, the non-doped Si film 55 may be formed on the insulation film 52 and in the groove 53 of the semiconductor wafers 10 so as to have the opening portion 54. In other words, in the first film-forming process, the non-doped Si film 55 is not formed to completely embed the groove 53, but may be formed in the groove 53 to have the opening portion 54. Accordingly, a void is definitely prevented from being generated in the groove 53 in the first film-forming process.

When a predetermined amount of the non-doped Si film 55 is formed on the semiconductor wafers 10, the supplying of the film-forming gas from the processing gas introduction pipe 13 is stopped. Then, as shown in FIG. 3(c), the predetermined amount of nitrogen is supplied from the purge gas supply pipe 15 into the inner pipe 3 while the inside of the reaction pipe 2 is set to the predetermined temperature, for example, 300° C., as shown in FIG. 3(a). Also, a gas inside the reaction pipe 2 is exhausted so as to depressurize the reaction pipe 2 to the predetermined pressure, for example, 40 Pa (0.3 Torr), as shown in FIG. 3(b). Then, the inside of the reaction pipe 2 is stabilized to these temperature and pressure (purging and stabilizing process). In order to definitely exhaust the gas inside the reaction pipe 2, the exhausting of the gas in the reaction pipe 2 and the supplying of the nitrogen gas may be repeatedly performed a plurality of times.

Here, the temperature inside the reaction pipe 2 may be from 100° C. to 550° C. When the temperature is lower than 100° C., the non-doped Si film 55 may not be etched during the etching process, and when the temperature is higher than 550° C., the etching of the non-doped Si film 55 may be difficult to be controlled. The pressure inside the reaction pipe 2 may be from 1.33 Pa to 133 Pa (from 0.01 Torr to 1 Torr).

Figure 4C:
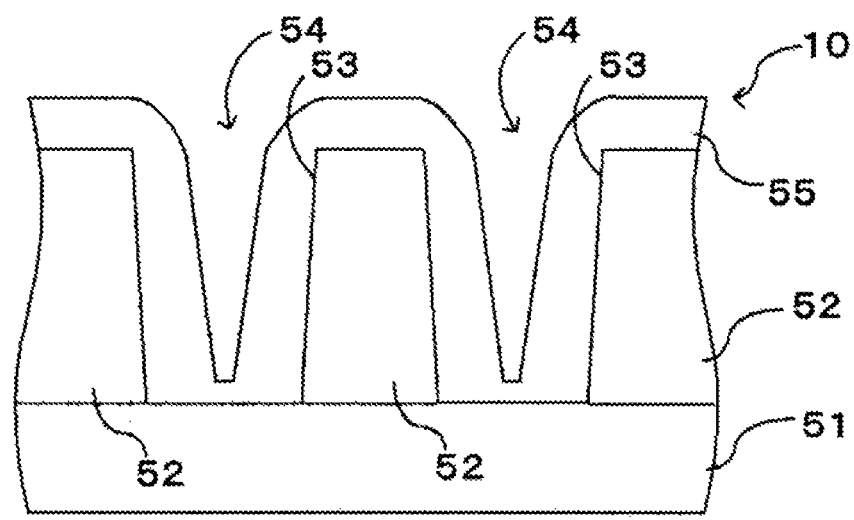

When the inside of the reaction pipe 2 is stabilized to the predetermined pressure and temperature, the predetermined amount of nitrogen is supplied from the purge gas supply pipe 15 into the inner pipe 3 as shown in FIG. 3(c) while a predetermined amount of etching gas, for example, $Cl_2$, is supplied from the processing gas introduction pipe 13 into the reaction pipe 2 as shown in FIG. 3(e) (etching process). Via the etching process, the non-doped Si film 55 having the opening portion 54 and formed in the groove 53 of the semiconductor wafers 10 is etched as shown in FIG. 4C.

Here, since the non-doped Si film 55 not doped with an impurity is used as a Si film to be etched, a surface roughness may be difficult to be deteriorated. This is because when an impurity-doped Si film, for example, a P-doped Si film, is used as a Si film to be etched, etching is performed from a P-site in the P-doped Si film. As such, since it is difficult for the surface roughness of the non-doped Si film 55 to be deteriorated, generation of a void or seam may be suppressed even when a Si film is formed via the second film-forming process described below.

Also, during the etching process, the opening portion 54 of the non-doped Si film 55 formed via the first film-forming process is enlarged via etching. In other words, as shown in FIG. 4C, an etching amount of the opening portion 54 is high while an etching amount of the non-doped Si film 55 formed near a bottom of the groove 53 is low. Accordingly, it is easy to form a Si film near the bottom of the groove 53 via the second film-forming process described below. Also, it is easy to dope an impurity on the non-doped Si film 55 near the bottom of the groove 53 via the doping process described below.

$Cl_2$ may be used as the etching gas for easy etching control of the non-doped Si film 55. When $Cl_2$ is used as the etching gas, the temperature inside the reaction pipe 2 may be from 250° C. to 300° C. The pressure inside the reaction pipe 2 may be from 1.33 Pa to 40 Pa (from 0.01 Torr to 0.3 Torr). When the temperature and pressure in the reaction pipe 2 are maintained within the above ranges, etching may be satisfactorily uniform.

Figure 5A:
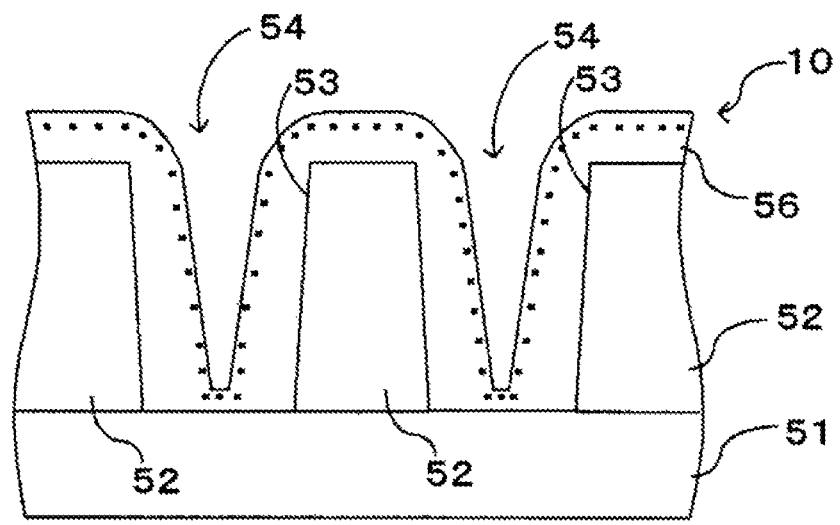
FIGS. 5A and 5B are views for explaining the method of forming a silicon film, according to an embodiment of the present invention.

When desired etching of the non-doped Si film 55 is completed, the supplying of the etching gas from the processing gas introduction pipe 13 is stopped. Then, the inside of the reaction pipe 2 is heated to the predetermined temperature, for example, 525° C., as shown in FIG. 3(a), while a gas inside the reaction pipe 2 is exhausted so as to depressurize the reaction pipe 2 to the predetermined pressure, for example, 74.5 Pa (0.56 Torr), as shown in FIG. 3(b). Also, as shown in FIG. 3(f), a predetermined amount of impurity, for example, $P(PH_3)$, is supplied from the processing gas introduction pipe 13 into the reaction pipe 2 (doping process). Via the doping process, an impurity (P) is doped on the non-doped Si film 55, and thus P-doped Si film 56 is formed as shown in FIG. 5A.

Here, since the opening portion 54 of the non-doped Si film 55 formed via the first film-forming process is etched to be enlarged in the etching process, it is easy to dope an impurity on the non-doped Si film 55 near the bottom of the groove 53.

Next, as shown in FIG. 3(c), the predetermined amount of nitrogen is supplied from the purge gas supply pipe 15 into the inner pipe 3 while stabilizing the inside of the reaction pipe 2 to 525° C. and 74.5 Pa (0.56 Torr) (purging and stabilizing process). Here, in order to definitely exhaust the gas inside the reaction pipe 2, the exhausting of the gas inside the reaction pipe 2 and the supplying of the nitrogen gas may be repeatedly performed a plurality of times.

When the inside of the reaction pipe 2 is stabilized to the predetermined pressure and temperature, the supplying of nitrogen from the purge gas supply pipe 15 is stopped. Then, as shown in FIG. 3(d), the predetermined amount of film-forming gases, such as $SiH_4$ and $PH_3$, are supplied from the processing gas introduction pipe 13 into the reaction pipe 2 (second film-forming process). Via the second film-forming process, the P-doped Si film 57 is formed on the P-doped Si film 56 as shown in FIG. 5B.

Here, since the opening portion 54 of the non-doped Si film 55 formed via the first film-forming process is etched to be enlarged via the etching process, it is easy to form the impurity-doped Si film 57 near the bottom of the groove 53. Accordingly, generation of a void or seam in the groove 53 may be suppressed when the impurity-doped Si film 57 in the groove 53 is embedded.

When the desired impurity-doped Si film 57 is formed, the supplying of film-forming gas from the processing gas introduction pipe 13 is stopped. Then, as shown in FIG. 3(c), the predetermined amount of nitrogen is supplied from the purge gas supply pipe 15 into the inner pipe 3 while the inside of the reaction pipe 2 is set to the predetermined temperature, for example, 400° C., as shown in FIG. 3(a). Also, by exhausting a gas inside the reaction pipe 2, the reaction pipe 2 is returned to an atmospheric pressure (purging process). In order to definitely exhaust the gas inside the reaction pipe 2, the exhausting of the gas inside the reaction pipe 2 and the supplying of nitrogen gas may be repeatedly performed a plurality of times. Then, by descending the cover body 7 by using the boat elevator 8, the semiconductor wafers 10 (wafer boat 9) are unloaded from the reaction pipe 2 (unloading process). Accordingly, forming of a Si film is completed.

Figure 5B:
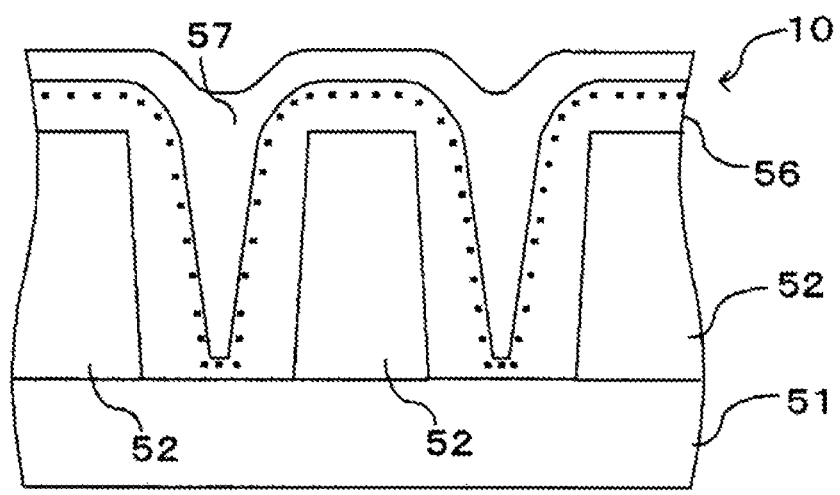

Next, in order to check an effect of the method of the present invention, a Si film was formed as shown in FIG. 5B on the semiconductor wafers 10 shown in FIG. 4A according to the recipe shown in FIG. 3. Upon observing the formed Si film by using a scanning electron microscope (SEM), it was checked that a void or seam was not generated.

As described above, according to the present embodiment, the generation of a void or seam in the formed Si film can be suppressed since the etching process of enlarging the opening portion 54 by etching the non-doped Si film 55, the doping process of doping the non-doped Si film 55 having the enlarged opening portion 54 with an impurity, and the second film-forming process of forming the impurity-doped Si film 57 are performed after the first film-forming process of forming the non-doped Si film 55 having the opening portion 54.

The present invention is not limited to the above embodiment, and may be variously modified and applied. Hereinafter, another embodiment applicable to the present invention will be described.

In the above embodiment, the first film-forming process, the etching process, the doping process, and the second film-forming process are performed, but for example, a seed layer forming process of forming a seed layer on the insulation film 52 and groove 53 may be performed before the first film-forming process. FIG. 6 shows a recipe of performing the seed layer forming process.

Figure 7A:
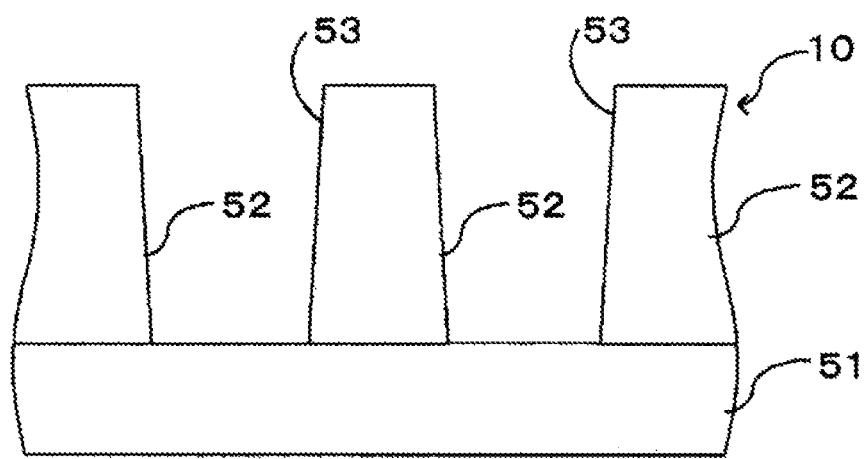
FIGS. 7A through 7C are views for explaining the method of forming a silicon film, according to the another embodiment of the present invention.

First, the inside of the reaction pipe 2 (inner pipe 3) is set to a predetermined temperature, for example, 400° C., as shown in FIG. 6(a). Also, as shown in FIG. 6(c), a predetermined amount of nitrogen is supplied from the purge gas supply pipe 15 into the inner pipe 3 (reaction pipe 2). Next, the wafer boat 9 accommodating the semiconductor wafer 10 shown in FIG. 7A is placed on the cover body 7. The cover body 7 is elevated by the boat elevator 8, thereby loading the semiconductor wafers 10 (wafer boat 9) in the reaction pipe 2 (loading process).

Next, the predetermined amount of nitrogen is supplied from the purge gas supply pipe 15 into the inner pipe 3 as shown in FIG. 6(c), while setting the inside of the reaction pipe 2 to the predetermined temperature, for example 400° C., as shown in FIG. 6(a). Also, by exhausting a gas inside the reaction pipe 2, the reaction pipe 2 is depressurized to a predetermined pressure, for example, 133 Pa (1 Torr), as shown in FIG. 6(b). Then, the inside of the reaction pipe 2 is stabilized to these temperature and pressure (stabilizing process).

A temperature inside the reaction pipe 2 may be from 350° C. to 500° C. When an amino group-containing silane is used as a seed layer forming gas, the temperature inside the reaction pipe 2 may be from 350° C. to 450° C. A pressure inside the reaction pipe 2 may be from 1.33 Pa to 133 Pa (from 0.01 Torr to 1 Torr). By setting the temperature and pressure in the reaction pipe 2 to be within the above ranges, the seed layer may be further uniformly formed.

Figure 7B:
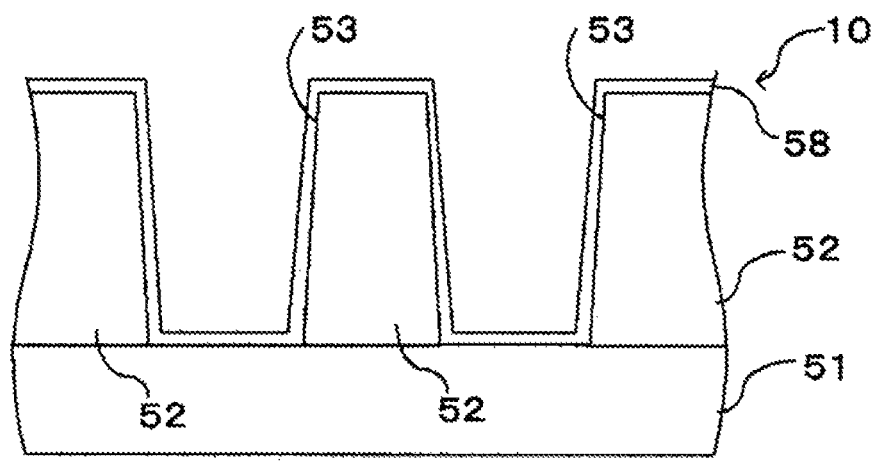

When the inside of the reaction pipe 2 is stabilized to the predetermined pressure and temperature, the supplying of nitrogen from the purge gas supply pipe 15 is stopped. Then, as shown in FIG. 6(g), a predetermined amount of seed layer forming gas, for example, $Si_2H_6$, is supplied from the processing gas introduction pipe 13 into the reaction pipe 2 (seed layer forming process). Via the seed layer forming process, a seed layer 58 is formed on the insulation film 52 and groove 53 of the semiconductor wafers 10 as shown in FIG. 7B. In the present embodiment, since a higher silane, i.e., $Si_2H_6$, is used as the seed layer forming gas, a thickness of the seed layer 58 may be from about 1 nm to about 2 nm. By forming the seed layer having the thickness from about 1 nm to about 2 nm, the surface roughness of the non-doped Si film 55 formed on the seed layer 58 may be decreased. Alternatively, when the amino group-containing silane is used as the seed layer forming gas, the seed layer 58 may be formed under a condition where a film-forming gas (source gas) is not thermally decomposed during a film-forming process.

When the seed layer 58 having a desired thickness is formed on the semiconductor wafers 10, the supplying of the seed layer forming gas from the processing gas introduction pipe 13 is stopped. Then, the predetermined amount of nitrogen is supplied from the purge gas supply pipe 15 into the inner pipe 3 as shown in FIG. 6(c), while the inside of the reaction pipe 2 is set to the predetermined temperature, for example, 525° C., as shown in FIG. 6(a). Also, a gas inside the reaction pipe 2 is exhausted to depressurize the reaction pipe 2 to the predetermined pressure, for example, 74.5 Pa (0.56 Torr), as shown in FIG. 6(b). Then, the inside of the reaction pipe 2 is stabilized to these temperature and pressure (purging and stabilizing process).

Figure 7C:
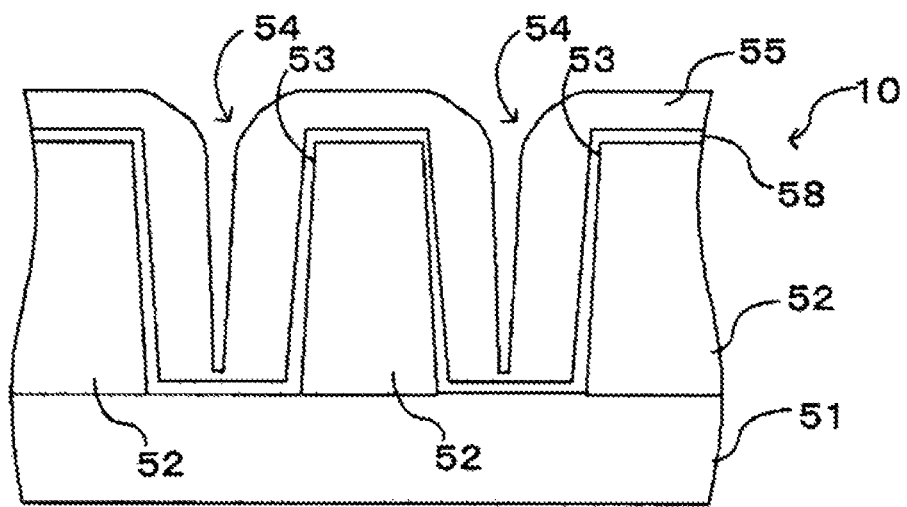

When the inside of the reaction pipe 2 is stabilized to the predetermined pressure and temperature, the supplying of nitrogen from the purge gas supply pipe 15 is stopped. As shown in FIG. 6(d), a predetermined amount of film-forming gas, for example, $SiH_4$, is supplied from the processing gas introduction pipe 13 into the reaction pipe 2 (first film-forming process). Via the first film-forming process, the non-doped Si film 55 is formed on the seed layer 58 of the semiconductor wafer 10 as shown in FIG. 7C.

Here, the non-doped Si film 55 is formed on the seed layer 58. Accordingly, the surface roughness of the non-doped Si film 55 may be reduced compared to when the non-doped Si film 55 is formed on two types of materials of the substrate 51 and insulation film 52. As a result, the generation of a void or seam may be further suppressed.

Also, the purging and stabilizing process, the etching process, the doping process, the purging and stabilizing process, the second film-forming process, the purging process, and the unloading process are performed like the above embodiment to complete the forming of a silicon film.

As such, by performing the seed layer forming process of forming a seed layer before the first film-forming process, the surface roughness of the formed non-doped Si film 55 may be reduced, thereby further suppressing the generation of a void or seam.

Also, in the above embodiment, the first film-forming process, the etching process, the doping process, and the second film-forming process are performed, but for example, a natural oxide film removing process of removing a natural oxide film formed at the bottom of the groove 53 may be performed before the first film-forming process. FIG. 8 shows a recipe of performing the natural oxide film removing process. Also, in the present example, ammonia ($NH_3$) and HF are used as a natural oxide film removing gas.

First, the inside of the reaction pipe 2 (inner pipe 3) is set to a predetermined temperature, for example, 150° C., as shown in FIG. 8(a). As shown in FIG. 8(c), a predetermined amount of nitrogen is supplied from the purge gas supply pipe 15 into the inner pipe 3 (reaction pipe 2). Next, the wafer boat 9 accommodating the semiconductor wafers 10 is placed on the cover body 7. Then, the cover body 7 is elevated by using the boat elevator 8, thereby loading the semiconductor wafers 10 (wafer boat 9) in the reaction pipe 2 (loading process).

Next, the predetermined amount of nitrogen is supplied from the purge gas supply pipe 15 into the inner pipe 3 as shown in FIG. 8(c) while the inside of the reaction pipe 2 is set to the predetermined temperature, for example, 150° C., as shown in FIG. 8(a). Also, a gas inside the reaction pipe 2 is exhausted to depressurize the reaction pipe 2 to a predetermined pressure, for example, 4 Pa (0.03 Torr), as shown in FIG. 8(b). Also, the inside of the reaction pipe 2 is stabilized to these temperature and pressure (stabilizing process).

The temperature inside the reaction pipe 2 may be from 25° C. to 200° C. The pressure inside the reaction pipe 2 may be from 0.133 Pa to 133 Pa (from 0.001 Torr to 1 Torr). By setting the temperature and pressure in the reaction pipe 2 to be within the above ranges, it is easy to remove a natural oxide film. When ammonia and $NF_3$ are used as the natural oxide film removing gas, the temperature of the semiconductor wafers 10 may exceed 600° C.

When the inside of the reaction pipe 2 is stabilized to the predetermined pressure and temperature, the supplying of nitrogen from the purge gas supply pipe 15 is stopped. Then, as shown in FIG. 8(g), predetermined amounts of ammonia and HF are supplied from the processing gas introduction pipe 13 into the reaction pipe 2 (natural oxide film removing process). Via the natural oxide film removing process, the natural oxide film formed at the bottom of the groove 53 of the semiconductor wafer 10 may be removed.

When the natural oxide film at the bottom of the groove 53 of the semiconductor wafer 10 is removed, the supplying of the natural oxide film removing gas from the processing gas introduction pipe 13 is stopped. Next, the predetermined amount of nitrogen is supplied from the purge gas supply pipe 15 into the inner pipe 3 as shown in FIG. 8($c$), while the inside of the reaction pipe 2 is set to the predetermined temperature, for example, 525° C., as shown in FIG. 8($a$). A gas inside the reaction pipe 2 is exhausted to depressurize the reaction pipe 2 to the predetermined pressure, for example, 74.6 Pa (0.56 Torr), as shown in FIG. 8($b$). Then, the inside of the reaction pipe 2 is stabilized to these temperature and pressure (purging and stabilizing process). When the natural oxide film is removed by using ammonia and HF, silicofluoride ammonium may be left on the substrate 51, but is sublimated since the temperature inside the reaction pipe 2 is 525° C. during the first film-forming process.

When the inside of the reaction pipe 2 is stabilized to the predetermined pressure and temperature, the supplying of nitrogen from the purge gas supply pipe 15 is stopped. Also, as shown in FIG. 8($d$), a predetermined amount of film-forming gas, for example, $SiH_4$, is supplied from the processing gas introduction pipe 13 into the reaction pipe 2 (first film-forming process). Via the first film-forming process, the non-doped Si film 55 is formed on the insulation film 52 and in the groove 53 of the semiconductor wafers 10.

Then, the purging and stabilizing process, the etching process, the doping process, the purging and stabilizing process, the second film-forming process, the purging process, and the unloading process are performed like the above embodiment to complete the forming of a silicon film.

As such, since the natural oxide film removing process of removing the natural oxide film formed at the bottom of the groove 53 is performed before the first film-forming process, characteristics of the formed Si film as an electrode may be prevented from being deteriorated.

Also, in the above embodiment, the first film-forming process, the etching process, the doping process, and the second film-forming process are performed, but for example, the second film-forming process may be performed after repeating the first film-forming process, the etching process, and the doping process a plurality of times. Also, even when the seed layer forming process or natural oxide film removing process is performed before the first film-forming process, the second film-forming process may be performed after repeating the first film-forming process, the etching process, and the doping process a plurality of times. In these cases, the generation of a void or seam may be further suppressed.

Alternatively, the seed layer forming process may be performed after the natural oxide film removing process, and then the first film-forming process, the etching process, the doping process, and the second film-forming process may be performed. In this case, the generation of a void or seam may be further suppressed.

In the above embodiment, the non-doped Si film 55 with the opening portion 54 is formed on the insulation film 52 and in the groove 53 of the semiconductor wafers 10 via the first film-forming process, but alternatively, the non-doped Si film 55 without the opening portion 54 may be formed via the first film-forming process. In this case, the non-doped Si film 55 may be etched via the etching process and doped with an impurity, and then an impurity-doped silicon film may be formed to embed the non-doped Si film 55, thereby obtaining the same effects as the above embodiment.

In the above embodiment, $SiH_4$ is used as the film-forming gas, but another gas may be used as long as a Si film, e.g., a polysilicon film or an amorphous silicon film, is formed.

In the above embodiment, P ($PH_3$) is used as a dopant (impurity), but the dopant is not limited thereto, and may be boron (B), arsenic (As), carbon (C), oxygen (O), or nitrogen (N). Also, the impurity is not limited to one type, and may be a plurality of types. When a plurality of types of impurity is used, the impurity may include an impurity containing P, B, or As that generates an electric carrier, and at least one impurity selected from among C, O, and N, which changes characteristics of a crystalline. By including at least one impurity selected from among C, O, and N, for example, a growth of grain may be suppressed.

In the above embodiment, $Cl_2$ is used as the etching gas, but alternatively, a gas capable of etching a non-doped Si film formed via the first film-forming process may be used, or another halogen gas, such as $F_2$ and $ClF_3$, may be used.

In the above embodiment, $Si_2H_6$ is used as the seed layer forming gas, but alternatively for example, a higher silane, such as an amino group containing silane or $Si_4H_{10}$, may be used. For example, when the amino group containing silane is used, an incubation time with respect to growth of a Si film may be reduced or surface roughness of the Si film may be improved. Also, in the above embodiment, ammonia and HF are used as the natural oxide film removing gas, but alternatively, for example, any gas, such as ammonia and $NF_3$, may be used as long as the natural oxide film at the bottom of the groove 53 is removed.

In the above embodiment, the batch type vertical thermal treatment apparatus having a double pipe structure is used as the thermal treatment apparatus, but alternatively, for example, a batch type thermal treatment apparatus having a single pipe structure may be used.

The controller 100 according to an embodiment of the present invention may be realized by using a general computer system instead of an exclusive system. For example, the controller 100 performing the above processes may be configured by installing a program for executing the above processes from a recording medium (flexible disk, CD-ROM, or the like) storing the program.

Also, a unit for supplying the program is arbitrary. Aside from supplying the program through a predetermined recording medium as described above, for example, the program may be supplied through a communication wire, a communication network, a communication system, or the like. In this case, for example, the program may be posted on a bulletin board system (BBS) of a communication network, and provided by a carrier wave through the communication network. Also, the program provided as such may be activated and executed like another application program under a control of an operating system (OS), thereby performing the above processes.

The present invention is advantageous in a method and apparatus for forming a silicon film.

According to the present invention, the generation of a void or seam can be suppressed.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of forming a silicon film on a groove which is formed in a surface of an object and has a bottom surface and side surfaces, the method comprising:

performing a first film-forming process of forming a non-doped silicon film which is not doped with an impurity on the bottom surface and the side surfaces of the groove such that an opening portion, which is opened upward in the groove, is formed in the groove;

performing an etching process of etching the non-doped silicon film formed via the first film-forming process so as to enlarge the opening portion of the non-doped silicon film;

performing a doping process of doping the non-doped silicon film etched via the etching process with an impurity; and performing a second film-forming process of forming an impurity-doped silicon film so as to embed the silicon film doped via the doping process.

2. The method of claim 1, wherein
the performing of the etching process comprises etching the non-doped silicon film such that the non-doped silicon film formed on the side surfaces of the groove becomes thinner and
the performing of the second film-forming process comprises forming the impurity-doped silicon film so as to embed the opening portion of the silicon film doped via the doping process.

3. The method of claim 1, further comprising performing a seed layer forming process of forming a seed layer on the surface of the object,
wherein the performing of the first film-forming process comprises forming the non-doped silicon film on the seed layer.

4. The method of claim 1, further comprising performing a natural oxide film removing process of removing a natural oxide film formed at a bottom of the groove of the object.

5. The method of claim 1, wherein the impurity doped during the performing of the doping process and the impurity of the impurity-doped silicon film formed during the performing of the second film-forming process comprise a impurity containing phosphorous (P) or boron (B) and at least one impurity selected from among carbon (C), oxygen (O), and nitrogen (N).

6. The method of claim 1, wherein the first film-forming process, the etching process, and the doping process are repeatedly performed a plurality of times, and then the second film-forming process is performed.

7. The method of claim 1, wherein the first film-forming process, the etching process, the doping process, and the second film-forming process are continuously performed while the object is accommodated in a reaction chamber.

8. An apparatus for forming a silicon film on a groove which is formed in a surface of an object and had a bottom surface and side surfaces, the apparatus comprising:
a first film-forming unit which forms a non-doped silicon film that is not doped with an impurity on the bottom surface and the side surfaces of the groove such that an opening portion, which is opened upward in the groove, is formed in the groove;
an etching unit which etches the non-doped silicon film formed by using the first film-forming unit process so as to enlarge the opening portion of the non-doped silicon film;
a doping unit which dopes the non-doped silicon film etched by using the etching unit with an impurity; and
a second film-forming unit which forms an impurity-doped silicon film so as to embed the silicon film doped by using the doping unit.

9. The apparatus of claim 8, wherein
the etching unit etches the non-doped silicon film such that the non-doped silicon film formed on the side surfaces of the groove becomes thinner and
the second film-forming unit forms the impurity-doped silicon film so as to embed the opening portion of the silicon film doped by using the doping unit.

10. The apparatus of claim 8, further comprising a seed layer forming unit which forms a seed layer on the surface of the object,
wherein the first film-forming unit forms the non-doped silicon film on the seed layer.

11. The apparatus of claim 8, further comprising a natural oxide film removing unit which removes a natural oxide film formed at a bottom of the groove of the object.

12. The apparatus of claim 8, wherein the impurity doped by the doping unit and the impurity of the impurity-doped silicon film formed by the second film-forming unit comprise a impurity containing phosphorous (P) or boron (B) and at least one impurity selected from among carbon (C), oxygen (O), and nitrogen (N).

13. A method of forming a silicon film on a groove which is formed in a surface of an object, the method comprising:
performing a first film-forming process of forming a non-doped silicon film which is not doped with an impurity, so as to embed the groove of the object;
performing an etching process of etching the non-doped silicon film formed via the first film-forming process;
performing a doping process of doping the non-doped silicon film etched via the etching process with an impurity; and
performing a second film-forming process of forming an impurity-doped silicon film so as to embed the silicon film doped via the doping process,
wherein the first film-forming process, the etching process, and the doping process are repeatedly performed a plurality of times, and then the second film-forming process is performed.

14. A method of forming a silicon film on a groove which is formed in a surface of an object, the method comprising:
performing a first film-forming process of forming a non-doped silicon film which is not doped with an impurity, so as to embed the groove of the object;
performing an etching process of etching the non-doped silicon film formed via the first film-forming process;
performing a doping process of doping the non-doped silicon film etched via the etching process with an impurity; and
performing a second film-forming process of forming an impurity-doped silicon film so as to embed the silicon film doped via the doping process,
wherein the first film-forming process, the etching process, the doping process, and the second film-forming process are continuously performed while the object is accommodated in a reaction chamber.

* * * * *